(12) United States Patent
Kudo

(10) Patent No.: US 10,742,175 B2
(45) Date of Patent: Aug. 11, 2020

(54) AMPLIFIER CIRCUIT, RECEPTION CIRCUIT, AND SEMICONDUCTOR INTEGRATED CIRCUIT

(71) Applicant: Socionext Inc., Yokohama-shi, Kanagawa (JP)

(72) Inventor: Masahiro Kudo, Yokohama (JP)

(73) Assignee: SOCIONEXT INC., Yokohama (JP)

( * ) Notice: Subject to any disclaimer, the term of this patent is extended or adjusted under 35 U.S.C. 154(b) by 154 days.

(21) Appl. No.: 16/110,801

(22) Filed: Aug. 23, 2018

(65) Prior Publication Data
US 2018/0367103 A1 Dec. 20, 2018

Related U.S. Application Data

(63) Continuation of application No. PCT/JP2016/057748, filed on Mar. 11, 2016.

(51) Int. Cl.
*H03F 3/45* (2006.01)
*H03F 1/30* (2006.01)
(Continued)

(52) U.S. Cl.
CPC ........... *H03F 1/30* (2013.01); *H03F 3/45183* (2013.01); *H03F 3/45766* (2013.01);
(Continued)

(58) Field of Classification Search
CPC ....................................................... H03F 3/45
(Continued)

(56) References Cited

U.S. PATENT DOCUMENTS 6,278,325 B1 * 8/2001 Juang .................. H03F 3/45085
330/254
7,403,071 B2 * 7/2008 Hollenbeck ............. H03F 3/191
330/254
(Continued)

FOREIGN PATENT DOCUMENTS

EP    1415392        5/2004
JP    H04-135304 A   5/1992
(Continued)

OTHER PUBLICATIONS

International Search Report (with English Translation) and Written Opinion dated Apr. 12, 2016 issued in International Application No. PCT/JP2016/057748.
(Continued)

*Primary Examiner* — Henry Choe
(74) *Attorney, Agent, or Firm* — Arent Fox LLP

(57) ABSTRACT

An amplifier circuit includes: an input circuit configured to receive an input signal; a load circuit provided in series with the input circuit and including a first variable resistance unit and a second variable resistance unit, a resistance value of the first variable resistance unit being controlled by a digital code, a resistance value of the second variable resistance unit being controlled by an analog control voltage; and a correction circuit including a third variable resistance unit having a circuit configuration corresponding to the first variable resistance unit and a fourth variable resistance unit having a circuit configuration corresponding to the second resistance unit, a resistance value of the third variable resistance unit being controlled by the digital code, a resistance value of the fourth variable resistance unit being controlled by the analog control voltage, the correction circuit being configured correct a resistance value of the load circuit.

21 Claims, 5 Drawing Sheets

(51) Int. Cl.
  *H03G 3/30* (2006.01)
  *H03G 1/00* (2006.01)
  *H03G 3/00* (2006.01)
  *H03K 5/24* (2006.01)

(52) U.S. Cl.
  CPC ....... *H03F 3/45771* (2013.01); *H03G 1/0029* (2013.01); *H03G 1/0088* (2013.01); *H03G 3/001* (2013.01); *H03G 3/30* (2013.01); *H03K 5/24* (2013.01); *H03F 2200/447* (2013.01); *H03F 2200/453* (2013.01); *H03F 2203/45208* (2013.01); *H03F 2203/45624* (2013.01); *H03F 2203/45726* (2013.01)

(58) Field of Classification Search
  USPC .................................................. 330/253, 254
  See application file for complete search history.

(56) References Cited

U.S. PATENT DOCUMENTS

| | | |
|---|---|---|
| 2003/0030491 A1 | 2/2003 | Hart |
| 2005/0248396 A1 | 11/2005 | Caresosa et al. |
| 2007/0103235 A1* | 5/2007 | Heck .................. H03F 3/45183 330/253 |
| 2007/0214884 A1 | 9/2007 | Sakima et al. |
| 2007/0290746 A1 | 12/2007 | Arnott |
| 2011/0304375 A1 | 12/2011 | Zanchi |
| 2013/0057345 A1* | 3/2013 | Kimura ................ G11C 19/184 330/253 |
| 2015/0326197 A1 | 11/2015 | Jayaraman et al. |

FOREIGN PATENT DOCUMENTS

| | | |
|---|---|---|
| JP | 2003-084728 A | 3/2003 |
| JP | 2007-248288 A | 9/2007 |
| JP | 2009-225205 A | 10/2009 |
| JP | 2011-055055 A | 3/2011 |

OTHER PUBLICATIONS

Liu, Xiong, et al., "A 1.5 GHz Linear-in-dB Variable Gain Amplifier with Process and Temperature Tracking in 0.18-μm CMOS", ASIC, 2009, ASICON '09. IEEE 8th International Conference On, IEEE, Piscataway, NJ, USA(pp. 266-269), Oct. 2009.
Communication from the European Patent Office in counterpart European Application No. 16893521.1, dated Feb. 22. 2019.
Communication from the European Patent Office in counterpart European Application No. 16893521.1, dated Mar. 25, 2020.

* cited by examiner

US 10,742,175 B2

AMPLIFIER CIRCUIT, RECEPTION CIRCUIT, AND SEMICONDUCTOR INTEGRATED CIRCUIT

CROSS-REFERENCE TO RELATED APPLICATION

This application is a continuation application of International Application No. PCT/JP2016/057748 filed on Mar. 11, 2016, and designated the U.S., the en tire contents of which are incorporated herein by reference.

FIELD

The present invention relates to an amplifier circuit, a reception circuit, and a semiconductor integrated circuit.

BACKGROUND

In analog signal processing, a resistance element has been used widely as an element that converts a current signal to a voltage signal. In such a circuit, a resistance value of the resistance element affects circuit characteristics such as a gain of an amplifier circuit and a cutoff frequency of a filter circuit, for example. Generally, there is a certain range of variations in the resistance value of a resistance element formed in a semiconductor process, and the resistance value sometimes depends on an ambient temperature.

In order to keep the gain of an amplifier circuit of a resistance load constant, for example, it is necessary to keep the gain to a constant value by correcting variations or fluctuations in the resistance value of the resistance load. As one method of keeping the gain to a constant value by correcting variations or fluctuations in the resistance value, there is a method of using a variable resistance circuit capable of changing the resistance value by means of control.

FIG. 6A is a diagram illustrating a configuration example of a variable resistance circuit in which a resistance value is controlled in a digital manner. The variable resistance circuit includes a plurality of resistors 601-1, 601-2, ... , 601-N, and PMOS transistors 602-1, 602-2, ... , 602-N controlling whether or not to supply current are connected to the resistors 601-1, 601-2, ... , 601-N respectively.

The PMOS transistors 602-1, 602-2, ... , 602-N are controlled so as to be brought into an on state (conductive state)/an off state (non-conductive state) by control signals S1, S2, ... , SN to be supplied to gates thereof respectively. The number of the PMOS transistors 602-1, 602-2, ... , 602-N to be brought into an on state is controlled by the control signals S1, S2, ... , SN, thereby making it possible to control the number of the resistors 601-1, 601-2, ... , 601-N in which the current flows between a terminal and a power supply potential and change a combined resistance value.

FIG. 6B is a diagram illustrating a configuration example of a variable resistance circuit in which a resistance value is controlled in an analog manner. Resistors 611, 612 are connected in series between a power supply potential and a terminal, and a PMOS transistor 613 as a variable resistance is connected in parallel to the resistor 611. A gate voltage VG is supplied to a gate of the PMOS transistor 613, and by controlling the voltage VG, the PMOS transistor 613 controls on-resistance corresponding to a gate-source voltage.

When a resistance value of the resistor 611 is set to RP, a resistance value of the resistor 612 is set to RS, and a resistance value of the on-resistance of the PMOS transistor 613 is set to RON, in the configuration illustrated in FIG. 6B, a combined resistance value RS+{RP·RON/(RP+RON)} is obtained. For example, when the PMOS transistor 613 is in an on state (the resistance value RON of the on-resistance is almost zero), the combined resistance value becomes RS, and when the PMOS transistor 613 is in an off state, the combined resistance value becomes (RS+RP).

Accordingly, the variable resistance circuit illustrated in FIG. 6B can change the resistance value from the resistance value RS to the resistance value (RS+RP) by controlling the gate voltage VG to be supplied to the gate of the PMOS transistor 613. Incidentally, the resistor 611 illustrated in FIG. 6B can be omitted by bringing into an open state (infinite resistance), and the resistor 612 can be omitted by bringing into a short-circuit state (zero resistance).

Such a variable resistance circuit as illustrated in FIG. 6A or 6B is applied as the resistance load of the amplifier circuit to change the resistance value by means of control, thereby making it possible to keep the gain of the amplifier circuit constant. However, in the variable resistance circuit illustrated in FIG. 6A, an adjustment step of the resistance value is finite and the change in the resistance value is discrete, and thus accuracy with respect to a desired resistance value is limited. Further, in the case where control of the resistance values is performed by using control signals obtained by advance calibration or the like at the time of actual use, the variable resistance circuit does not follow fluctuations in the resistance value caused by environmental changes of temperature or the like after the calibration and a fluctuation amount results in an error.

Further, the variable resistance circuit illustrated in FIG. 6B controls a variable range of the resistance value by the gate voltage in a range where the PMOS transistor 613 is turned on, and thus the sensitivity of the gate voltage with respect to the resistance value is high. Therefore, when the variable resistance circuit tries to correspond to a resistance value in a wide range, a slight error of the gate voltage greatly affects the change in the resistance value. Accordingly, the resistance value of the variable resistance is liable to be affected by noise or the like.

Regarding the technique that corrects temperature-dependent properties, there has been proposed a voltage generation circuit that includes a circuit performing temperature compensation by analog control and a circuit performing temperature compensation by digital control and performs switching between the analog control and the digital control according to a temperature region (for example, Patent Literature 1). Further, there has been proposed a sensor amplification circuit that performs, at correction points set at predetermined temperature intervals, digital correction to correct an input signal to a target value based on correction data set beforehand for each correction point and performs analog correction to offset temperature dependency of the input signal based on a gradient calculated from the correction points that are adjacent to each other between the correction points (see Patent Literature 2, for example).

Patent Literature 1: Japanese Laid-open Patent Publication No. 2003-84728

Patent Literature 2: Japanese Laid-open Patent Publication No. 2007-248288

SUMMARY

One aspect of an amplifier circuit includes: an input circuit configured to receive an input signal; a load circuit that is provided in series with the input circuit between a first power supply line and a second power supply line and includes a first variable resistance unit and a second variable resistance unit, a resistance value of the first variable resistance unit being controlled by a digital code, a resistance value of the second variable resistance unit being controlled by an analog control voltage; and a correction circuit that is provided between the first power supply line and the second power supply line, and includes a third variable resistance unit having a circuit configuration corresponding to the first variable resistance unit and a fourth variable resistance unit having a circuit configuration corresponding to the second variable resistance unit, a resistance value of the third variable resistance unit being controlled by the digital code, a resistance value of the fourth variable resistance unit being controlled by the analog control voltage, the correction circuit being configured to correct a resistance value of the load circuit.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, embodiments of the present invention will be described on the basis of the drawings.

Figure 1:
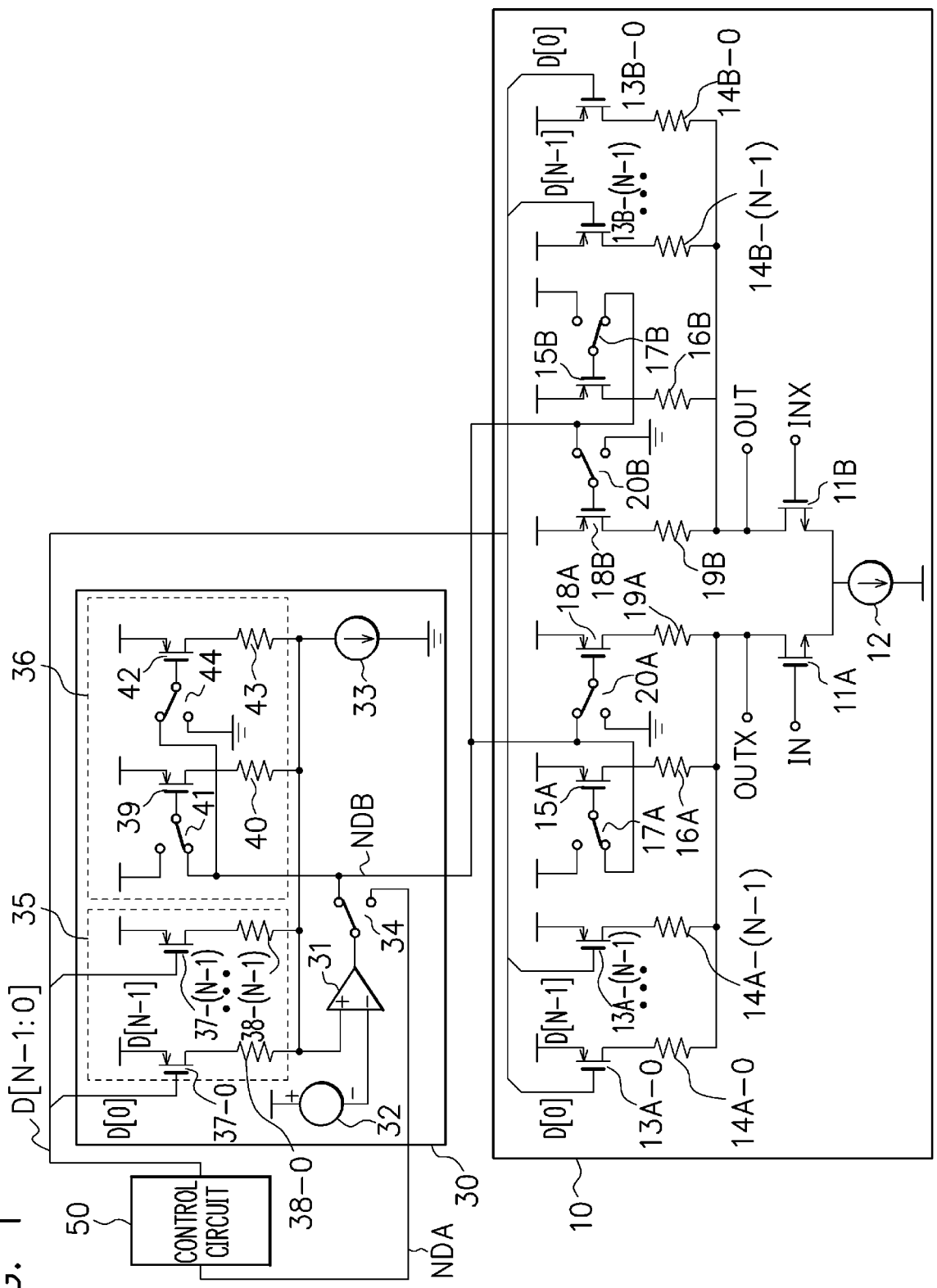
FIG. 1 is a diagram illustrating a configuration example of an amplifier circuit in an embodiment of the present invention.

FIG. 1 is a diagram illustrating a configuration example of an amplifier circuit in one embodiment of the present invention. The amplifier circuit in this embodiment includes an amplifying circuit 10, a correction circuit 30, and a control circuit 50. The amplifying circuit 10 includes an input circuit that receives an input signal and a load circuit that is composed of variable resistance circuits each used as a load, and a resistance value of the load circuit is controlled to a desired resistance value. The amplifying circuit 10 amplifies differential input signals by a specific gain (magnification) to output the amplified resultant.

In the amplifying circuit 10, NMOS transistors 11A, 11B included in the input circuit unit compose driving elements in a differential amplifying circuit. A gate of the NMOS transistor 11A is connected to an input terminal IN to which one signal of differential input signals is input, and a source thereof is connected to a current supply 12 connected to a power supply line of a reference potential VSS (ground potential, for example). Further, a gate of the NMOS transistor 11B is connected to an input terminal INX to which the other signal of the differential input signals is input, and a source thereof is connected to the current supply 12 connected to the power supply line of the reference potential VSS.

A PMOS transistor 13A-i and a resistor 14A-i included in the load circuit are connected in series between a power supply line of a power supply potential VDD and a drain of the NMOS transistor 11A. A variable resistance circuit including the PMOS transistor 13A-i and the resistor 14A-i corresponds to a first variable resistance unit of the load circuit provided in series with the NMOS transistor 11A between the power supply line of the power supply potential VDD and the power supply line of the reference potential VSS. Incidentally, i is a subscript, and is a natural number of 0 to N−1 (N is arbitrary) (the same applies hereinafter).

A source of the PMOS transistor 13A-i is connected to the power supply line of the power supply potential VDD, a drain of the PMOS transistor 13A-i is connected to one end of the resistor 14A-i, and the other end of the resistor 14A-i is connected to the drain of the NMOS transistor 11A. To a gate of the PMOS transistor 13A-i, a digital code D[i] output from the control circuit 50 is input.

It is possible to change a combined resistance value by controlling the number of resistors 14A-0 to 14A-(N−1) through which current flows by controlling the number of PMOS transistors 13A-0 to 13A-(N−1) that are brought into an on state by a digital code D[N−1:0]. In this manner, by the digital code D[i] output from the control circuit 50, a resistance value in the first variable resistance unit in the load circuit is controlled in a digital manner.

A PMOS transistor 15A and a resistor 16A included in the load circuit are connected in series between the power supply line of the power supply potential VDD and the drain of the NMOS transistor 11A. That is, a source of the PMOS transistor 15A is connected to the power supply line of the power supply potential VDD, a drain of the PMOS transistor 15A is connected to one end of the resistor 16A, and the other end of the resistor 16A is connected to the drain of the NMOS transistor 11A. A gate of the PMOS transistor 15A is selectively connected to the power supply line of the power supply potential VDD or a signal line NDB to which an analog control voltage is supplied via a switch 17A.

Further, a PMOS transistor 18A and a resistor 19A included in the load circuit are connected in series between the power supply line of the power supply potential VDD and the drain of the NMOS transistor 11A. That is, a source of the PMOS transistor 18A is connected to the power supply line of the power supply potential VDD, a drain of the PMOS transistor 18A is connected to one end of the resistor 19A, and the other end of the resistor 19A is connected to the drain of the NMOS transistor 11A. A gate of the PMOS transistor 18A is selectively connected to the power supply line of the reference potential VSS or the signal line NDB to which the analog control voltage is supplied via a switch 20A.

A variable resistance circuit including the PMOS transistors 15A, 18A, the resistors 16A, 19A, and the switches 17A, 20A, which are described previously, corresponds to a second variable resistance unit of the load circuit that is provided in series with the NMOS transistor 11A between the power supply line of the power supply potential VDD and the power supply line of the reference potential VSS. The switches 17A, 20A are set so that the gates of the PMOS transistors 15A, 18A and the signal line NDB to which the analog control voltage is supplied are connected, to control the analog control voltage, thereby making it possible to control on-resistances of the PMOS transistors 15A, 18A and change resistance values. In this manner, by the analog control voltage, a resistance value in the second variable resistance unit of the load circuit is controlled in an analog manner.

In the same manner, a PMOS transistor 13B-i and a resistor 14B-i included in the load circuit are connected in series between the power supply line of the power supply potential VDD and a drain of the NMOS transistor 11B. A variable resistance circuit including the PMOS transistor 13B-i and the resistor 14B-i corresponds to the first variable resistance unit of the load circuit that is provided in series with the NMOS transistor 11B between the power supply line of the power supply potential VDD and the power supply line of the reference potential VSS.

A source of the PMOS transistor 13B-i is connected to the power supply line of the power supply potential VDD, a drain of the PMOS transistor 13B-i is connected to one end of the resistor 14B-i, and the other end of the resistor 14B-i is connected to the drain of the NMOS transistor 11B. To a gate of the PMOS transistor 13B-i, the digital code D[i] output from the control circuit 50 is input.

It is possible to change a combined resistance value by controlling the number of resistors 14B-0 to 14B-(N−1) through which current flows by controlling the number of PMOS transistors 13B-0 to 13B-(N−1) that are brought into an on state by the digital code D[N−1:0]. In this manner, by the digital code D[i] output from the control circuit 50, a resistance value in the first variable resistance unit in the load circuit is controlled in a digital manner.

A PMOS transistor 15B and a resistor 16B included in the load circuit are connected in series between the power supply line of the power supply potential VDD and the drain of the NMOS transistor 11B. That is, a source of the PMOS transistor 15B is connected to the power supply line of the power supply potential VDD, a drain of the PMOS transistor 15B is connected to one end of the resistor 16B, and the other end of the resistor 16B is connected to the drain of the NMOS transistor 11B. A gate of the PMOS transistor 15B is selectively connected to the power supply line of the power supply potential VDD or the signal line NDB to which the analog control voltage is supplied via a switch 17B.

Further, a PMOS transistor 18B and a resistor 19B included in the load circuit are connected in series between the power supply line of the power supply potential VDD and the drain of the NMOS transistor 11B. That is, a source of the PMOS transistor 18B is connected to the power supply line of the power supply potential VDD, a drain of the PMOS transistor 18B is connected to one end of the resistor 19B, and the other end of the resistor 19B is connected to the drain of the NMOS transistor 11B. A gate of the PMOS transistor 18B is selectively connected to the power supply line of the reference potential VSS or the signal line NDB to which the analog control voltage is supplied via a switch 20B.

A variable resistance circuit including the PMOS transistors 15B, 18B, the resistors 16B, 19B, and the switches 17B, 20B, which are described previously, corresponds to the second variable resistance unit of the load circuit that is provided in series with the NMOS transistor 11B between the power supply line of the power supply potential VDD and the power supply line of the reference potential VSS. The switches 17B, 20B are set so that the gates of the PMOS transistors 15B, 18B and the signal line NDB to which the analog control voltage is supplied are connected, to control the analog control voltage, thereby making it possible to control on-resistances of the PMOS transistors 15B, 18B and change resistance values. In this manner, by the analog control voltage, a resistance value in the second variable resistance unit of the load circuit is controlled in an analog manner.

A potential of a connection point between the drain of the NMOS transistor 11B and the load circuit is output as one signal OUT of differential output signals, and a potential of a connection point between the drain of the NMOS transistor 11A and the load circuit is output as the other signal OUTX of the differential output signals.

The correction circuit 30 includes an operational amplifier (amplifier) 31, a voltage supply 32, a current supply 33, a third variable resistance unit 35, and a fourth variable resistance unit 36. The operational amplifier 31 amplifies a difference voltage between a voltage that is voltage-dropped from the power supply potential VDD by the third variable resistance unit 35 and the fourth variable resistance unit 36 and a reference voltage generated by the voltage supply 32 to output the amplified resultant. The voltage supply 32, when a combined resistance value by the third variable resistance unit 35 and the fourth variable resistance unit 36 is a desired resistance value, generates a voltage equal to the voltage that is voltage-dropped from the power supply potential VDD by the third variable resistance unit 35 and the fourth variable resistance unit 36. The current supply 33 is a current supply for supplying a certain current to the third variable resistance unit 35 and the fourth variable resistance unit 36.

The third variable resistance unit 35 has a circuit configuration corresponding to the first variable resistance unit in the amplifying circuit 10. That is, the third variable resistance unit 35 has a circuit configuration equivalent to that of the first variable resistance unit. The third variable resistance unit 35 is a variable resistance circuit including a PMOS transistor 37-i and a resistor 38-i. Incidentally, a resistance value of the resistor 38-i included in the third variable resistance unit 35 is determined according to a current value of the current supply 33, and does not necessarily need to be the same as the resistance value of the resistor included in the first variable resistance unit. For example, the resistance value of the resistor 38-i in the third variable resistance unit 35 may be adjusted within a range where the product of the combined resistance value by the third variable resistance unit 35 and the fourth variable resistance unit 36 and the current value of the current supply 33 becomes constant.

A source of the PMOS transistor 37-i is connected to the power supply line of the power supply potential VDD, a drain of the PMOS transistor 37-i is connected to one end of the resistor 38-i, and the other end of the resistor 38-i is connected to the power supply line of the reference potential VSS via the current supply 33. To a gate of the PMOS transistor 37-i, the digital code D[i] output from the control circuit 50 is input.

It is possible to change a combined resistance value by controlling the number of resistors 38-0 to 38-(N−1) through which current flows by controlling the number of PMOS transistors 37-0 to 37-(N−1) that are brought into an on state by the digital code D[N−1:0]. In this manner, by the digital code D[i] output from the control circuit 50, a resistance value in the third variable resistance unit 35 is controlled in a digital manner.

The fourth variable resistance unit 36 has a circuit configuration corresponding to the second variable resistance unit in the amplifying circuit 10. That is, the fourth variable resistance unit 36 has a circuit configuration equivalent to that of the second variable resistance unit. The fourth variable resistance unit 36 is a variable resistance circuit including PMOS transistors 39, 42, resistors 40, 43, and switches 41, 44. Incidentally, resistance values of the resistors 40, 43 included in the fourth variable resistance unit 36 are determined according to a current value of the current supply 33, and do not necessarily need to be the same as the resistance values of the resistors included in the second variable resistance unit. For example, the resistance values of the resistors 40, 43 in the fourth variable resistance unit 36 may be adjusted within a range where the product of the combined resistance value by the third variable resistance unit 35 and the fourth variable resistance unit 36 and the current value of the current supply 33 becomes constant.

A source of the PMOS transistor 39 is connected to the power supply line of the power supply potential VDD, a drain of the PMOS transistor 39 is connected to one end of the resistor 40, and the other end of the resistor 40 is connected to the power supply line of the reference potential VSS via the current supply 33. A gate of the PMOS transistor 39 is selectively connected to the power supply line of the power supply potential VDD or the signal line NDB to which the analog control voltage is supplied via the switch 41.

Further, a source of the PMOS transistor 42 is connected to the power supply line of the power supply potential VDD, a drain of the PMOS transistor 42 is connected to one end of the resistor 43, and the other end of the resistor 43 is connected to the power supply line of the reference potential VSS via the current supply 33. A gate of the PMOS transistor 42 is selectively connected to the power supply line of the reference potential VSS or the signal line NDB to which the analog control voltage is supplied via the switch 44.

The switches 41, 44 are set so that the gates of the PMOS transistors 39, 42 and the signal line NDB to which the analog control voltage is supplied are connected, to control the analog control voltage, thereby making it possible to control on-resistances of the PMOS transistors 39, 42 and change resistance values. In this manner, by the analog control voltage, a resistance value in the fourth variable resistance unit 36 is controlled in an analog manner.

The control circuit 50 generates the digital code D[N−1:0] for controlling the resistance values to output it, and controls the switches 17A, 17B, 20A, 20B, 34, 41, 44, and so on included in the amplifying circuit. The control circuit 50 has a SAR (successive approximation register) function for determining the digital code D[N−1:0] based on the output of the operational amplifier 31 included in the correction circuit 30. The SAR function is a logical function in which values approximate to a desired value are compared successively, to thereby increase accuracy of the approximate value sequentially.

Figure 2A:
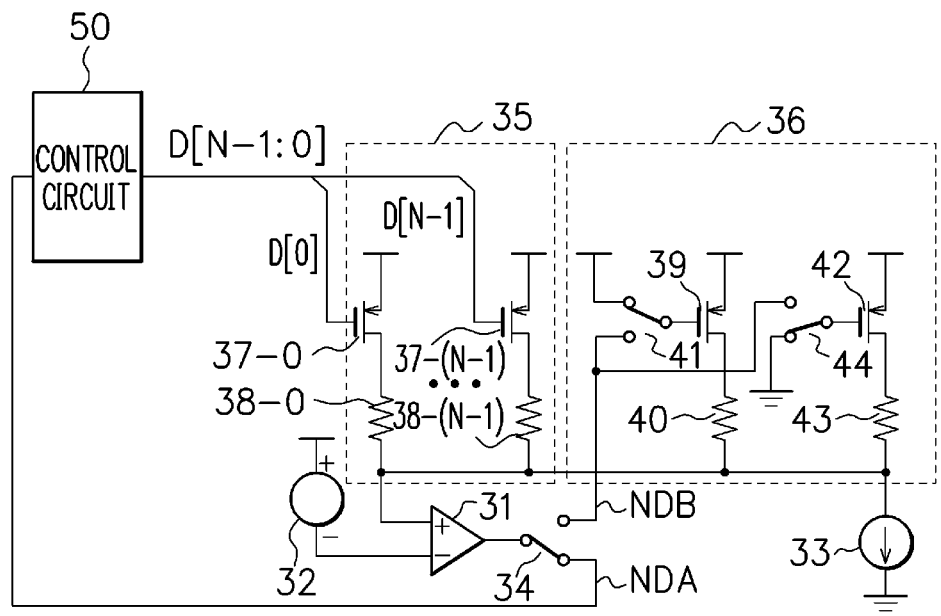
FIG. 2A is a diagram illustrating a state of a correction circuit at a digital correction time in this embodiment.

The control circuit 50, at a digital correction time for determining the digital code D[N−1:0], for example, controls the switches 34, 41, and 44 included in the correction circuit 30 as illustrated in FIG. 2A. That is, the control circuit 50 controls the switch 34 so as to connect the output of the operational amplifier and a signal line NDA in order to supply the output of the operational amplifier 31 to the control circuit 50. Further, the control circuit 50 controls the respective switches 41, 44 so that the power supply potential VDD is supplied to the gate of the PMOS transistor 39 and the reference potential VSS is supplied to the gate of the PMOS transistor 42. In this manner, the power supply potential VDD is supplied to one of correction units in the fourth variable resistance unit 36 and the reference potential VSS is supplied to the other of the correction units, thereby making it possible to control the resistance values to increase or decrease at an analog correction time thereafter, or the like.

Figure 2B:
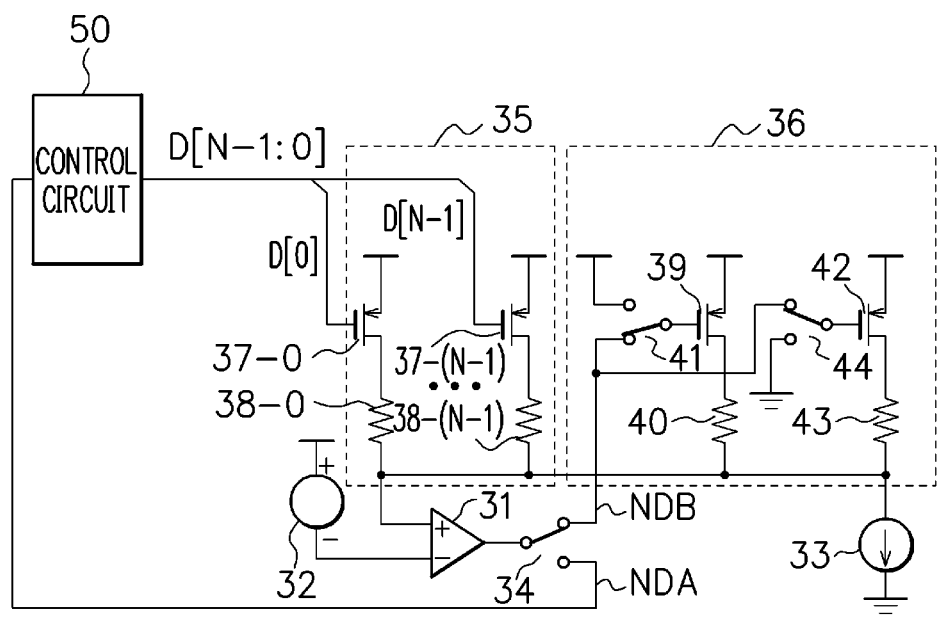
FIG. 2B is a diagram illustrating a state of the correction circuit at an analog correction time in this embodiment.

Further, the control circuit 50, at an analog correction time after the digital code D[N−1:0] is determined and at a normal operation time, for example, controls the switches 34, 41, and 44 included in the correction circuit 30 as illustrated in FIG. 2B. That is, the control circuit 50 controls the switch 34 so as to connect the output of the operational amplifier 31 and the signal line NDB in order to output the output of the operational amplifier 31 as the analog control voltage. Further, the control circuit 50 controls the respective switches 41, 44 so that the analog control voltage is supplied to the gates of the PMOS transistors 39, 42. At this time, the control circuit 50 also controls the respective switches 17A, 17B, 20A, and 20B so that the analog control voltage is supplied to the gates of the PMOS transistors 15A, 15B, 18A, and 18B included in the amplifying circuit 10.

Here, the resistance values of the resistors 14A-i, 14B-i included in the first variable resistance unit of the amplifying circuit 10 and the resistance value of the resistor 38-i included in the third variable resistance unit 35 of the correction circuit 30 all may be the same or different. In the case of the resistance values being different, in processing to determine the digital code D[N−1:0], it is only necessary to set the resistance values so that as the order in which a value is determined becomes later, contribution to a combined resistance value by a resistance value corresponding to its bit becomes smaller.

Figure 3:
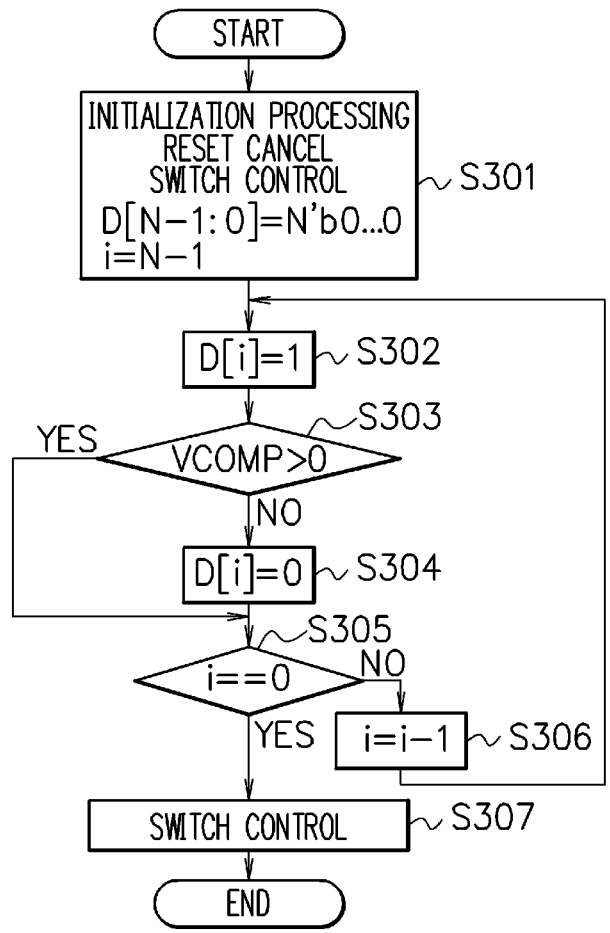
FIG. 3 is a flowchart illustrating an example of a resistance correction operation in this embodiment.

For example, in the case where a value of the digital code is determined from the (N−1)th bit to the 0th bit as illustrated in FIG. 3 to be described later, it is only necessary to set the resistance value of each resistor so that contribution to a combined resistance value by a resistance value corresponding to the (N−1)th bit becomes the largest, namely, contribution becomes the smallest as resistance values (conductance becomes maximum) and contribution to a combined resistance value by a resistance value corresponding to the 0th bit becomes the smallest, namely contribution becomes the largest as resistance values (conductance becomes minimum).

Next, there will be explained a resistance correction operation in the amplifier circuit in this embodiment. FIG. 3 is a flowchart illustrating an example of the resistance correction operation in this embodiment. The resistance correction operation is performed when the operation of the amplifier circuit starts, for example.

When the resistance correction operation is started, initialization processing is performed at step S301, and the control circuit 50 cancels reset, and controls the respective switches to be brought into the state at a digital correction time illustrated in FIG. 2A. Further, the control circuit 50 resets all bits of the digital code D[N−1:0] to 0, and sets a count value i of a counter included therein to (N−1).

Thereafter, loop processing for determining the digital code D[N−1:0] one bit by one bit is performed. First, at step S302, the control circuit 50 sets an ith-bit digital code D[i] to "1" based on the count value i of the counter. Then, at step S303, the control circuit 50 judges whether or not the output of the operational amplifier 31 in the correction circuit 30 is positive.

In the case where the output of the operational amplifier 31 is not positive, at step S304, the control circuit 50 changes the ith-bit digital code D[i] to "0." On the other hand, in the case where the output of the operational amplifier 31 is positive, step S304 is skipped, and the control circuit 50 keeps the ith-bit digital code D[i] to "1."

After determining the ith-bit digital code D[i], at step S305, the control circuit 50 judges whether or not the count value i of the counter is 0. In the case where the count value i of the counter is not 0, at step S306, the control circuit 50 subtracts 1 from the count value i of the counter and repeats the operations at and after step S302.

When the digital code D[i] is determined one bit by one bit sequentially and the count value i of the counter is judged to be 0 at step S305 as above, the digital code D[N−1:0] corresponding to a resistance value (first resistance value) according to the value of the reference voltage generated by the voltage supply 32 is determined. Then, at step S307, the control circuit 50 controls the respective switches to be brought into the state at an analog correction time illustrated in FIG. 2B.

After the control is performed in this manner, generation of the analog control voltage by a negative feedback controlling of the operational amplifier 31 is performed. In the generation of the analog control voltage, in the case where voltages generated by the third variable resistance unit 35 and the fourth variable resistance unit 36 are higher than the reference voltage generated by the voltage supply 32, the output voltage of the operational amplifier 31 rises. Thereby, the voltage to be supplied to the gates of the PMOS transistors 39, 42 in the fourth variable resistance unit 36 rises and the on-resistances of the PMOS transistors 39, 42 increase. The on-resistances of the PMOS transistors 39, 42 increase, and thereby voltage drop exhibiting to the current supplied by the current supply 33 increases and the voltages generated by the third variable resistance unit 35 and the fourth variable resistance unit 36 decrease.

In the case where the voltages generated by the third variable resistance unit 35 and the fourth variable resistance unit 36 are lower than the reference voltage generated by the voltage supply 32 similarly, the output voltage of the operational amplifier 31 decreases. Thereby, the voltage to be supplied to the gates of the PMOS transistors 39, 42 in the fourth variable resistance unit 36 decreases and the on-resistances of the PMOS transistors 39, 42 decrease. The on-resistances of the PMOS transistors 39, 42 decrease, and thereby voltage drop exhibiting to the current supplied by the current supply 33 decreases and the voltages generated by the third variable resistance unit 35 and the fourth variable resistance unit 36 increase.

The analog control voltage is generated by the negative feedback of the operational amplifier 31 in this manner, thereby making it possible to control the analog control voltage so that the combined resistance value by the third variable resistance unit 35 and the fourth variable resistance unit 36 results in a desired resistance value. As above, the digital code D[N−1:0] is determined, the analog control voltage is obtained, and the resistance correction operation is finished. Incidentally, the respective switches are controlled to be brought into the state illustrated in FIG. 2B even after the resistance correction operation is finished, and thus even with respect to the fluctuations in the resistance value caused by environmental changes such as temperature change, the analog control voltage is controlled, resulting in that it is possible to control the resistance values appropriately.

According to this embodiment as explained above, the correction circuit 30 is used to control the digital code D[N−1:0] and the analog control voltage so that the resistance value of the resistance load in the amplifying circuit 10 becomes a desired resistance value, thereby making it possible to set the resistance value of the resistance load in the amplifying circuit 10 to a desired resistance value. Further, by the digital correction based on the digital code D[N−1:0], rough adjustment is performed, and by the analog correction based on the analog control voltage, fine adjustment is performed, thereby making it possible to accurately control the resistance value. Further, an adjusted amount by the analog correction based on the analog control voltage in this embodiment is small as compared to that of a conventional method in which the resistance value is adjusted only by the analog correction, and thus it is possible to reduce the sensitivity of the analog control voltage with respect to the resistance value, resulting in an improvement in noise immunity.

Figure 4:
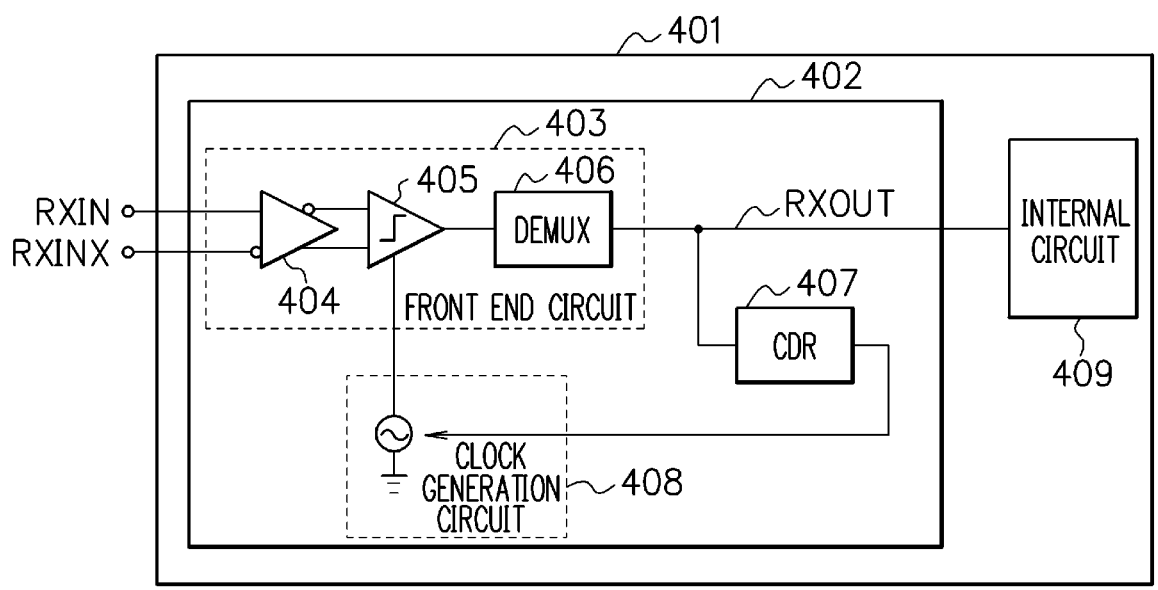
FIG. 4 is a diagram illustrating a configuration example of a semiconductor integrated circuit in an embodiment of the present invention.

FIG. 4 is a diagram illustrating a configuration example of a semiconductor integrated circuit including the amplifier circuit in this embodiment. A semiconductor integrated circuit 401 in this embodiment includes a reception circuit 402 having a function of a deserializer circuit that converts an input serial signal to a parallel signal, and an internal circuit 409 such as a logic circuit that performs a processing operation by receiving a parallel signal (data) from the reception circuit 402.

The reception circuit 402 includes a front end circuit 403, a clock data recovery circuit 407, and a clock generation circuit 408. The front end circuit 403 includes an amplifier circuit 404, a comparator (comparison circuit) 405, and a demultiplexer 406.

The amplifier circuit 404 is the amplifier circuit in this embodiment and receives differential input serial signals RXIN, RXINX transmitted through a transmission path or the like. Use of the amplifier circuit in this embodiment makes it possible to correct variations or fluctuations in the resistance value of the resistance load to keep the resistance value to a constant value, and fabricate the front end circuit 403 in the reception circuit 402 with small variations in gain.

The comparator 405 uses a clock signal output from the clock generation circuit 408 to sample the input serial signal at an appropriate timing and judges a data value (code) of the input serial signal. The demultiplexer 406 performs a serial-parallel conversion on an output of the comparator 405 to output the resultant as a parallel signal RXOUT.

The clock data recovery circuit 407 appropriately controls the phase of a clock signal output from the clock generation circuit 408 based on a received signal. The internal circuit 409 receives the parallel signal RXOUT output from the reception circuit 402 to perform a processing operation relating to the parallel signal RXOUT, or the like.

Figure 5:
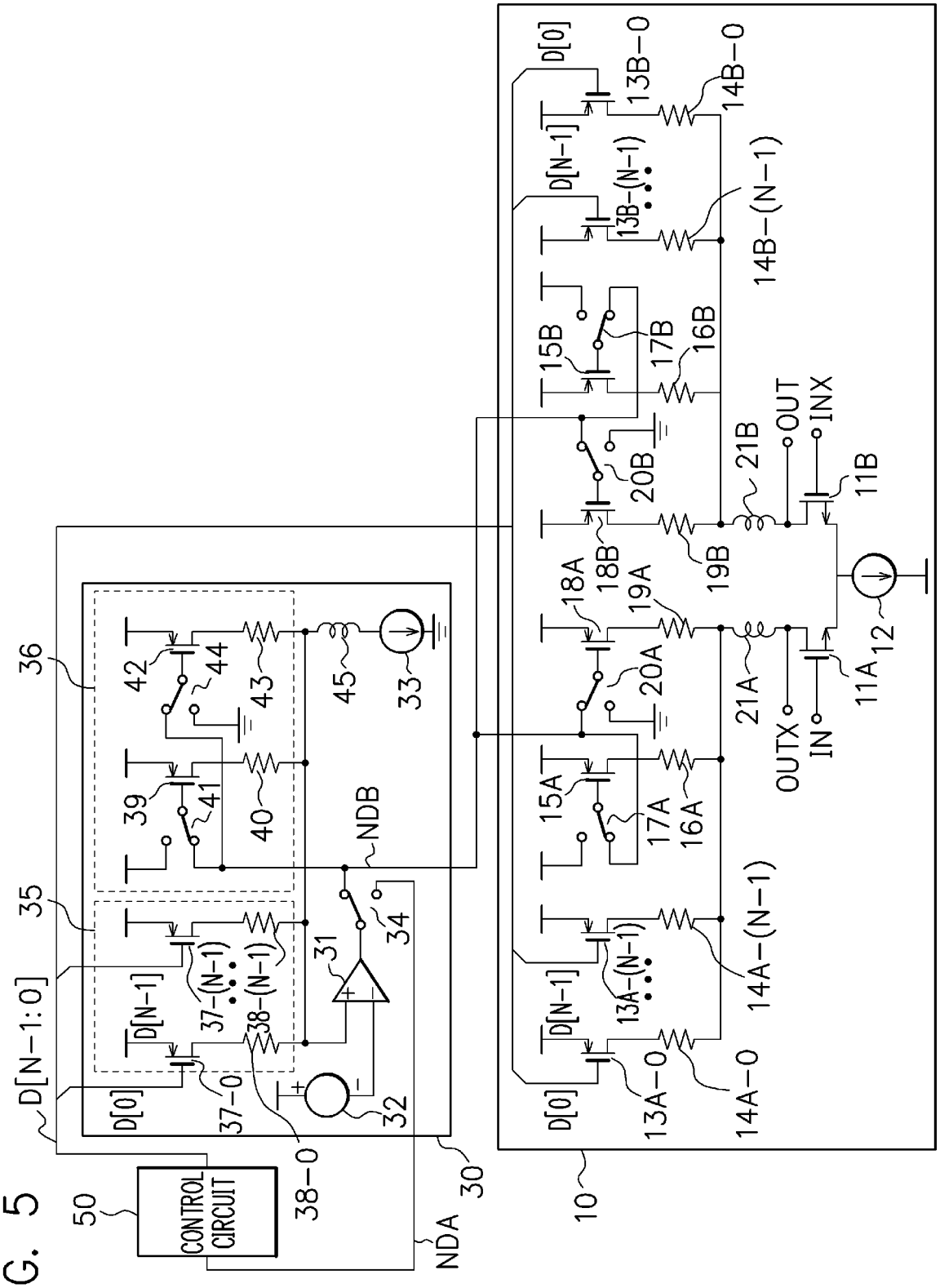
FIG. 5 is a diagram illustrating another configuration example of the amplifier circuit in this embodiment.
Figure 6A:
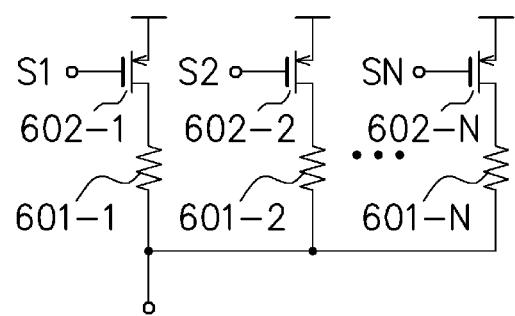
FIG. 6A is a diagram illustrating an example of a variable resistance circuit.
Figure 6B:
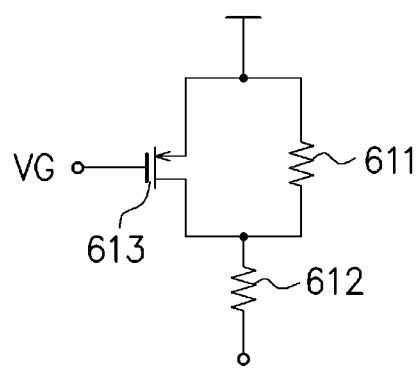
FIG. 6B is a diagram illustrating an example of a variable resistance circuit.

Here, the amplifying circuit in this embodiment may have a circuit configuration called a CTLE (continuous time linear equalizer), which is designed to have frequency characteristics in which the gain of a high-frequency component is increased rather than the gain of a low-frequency component, on the assumption that an input signal made by the high-frequency component being attenuated by a transmission path is input. FIG. 5 illustrates a configuration example of the amplifier circuit in this embodiment having a circuit configuration called a CTLE. In FIG. 5, the same reference numerals and symbols are added to the same components as those illustrated in FIG. 1, and their overlapping explanations are omitted.

In the amplifier circuit illustrated in FIG. 5, inductors 21A, 21B are provided between output terminals of the differential output signals OUTX, OUT and the variable resistance circuits included in the load circuit. Further, in order to consider parasitic resistance of the inductors, a similar inductor 45 is provided between the variable resistance circuits and the current supply in the correction circuit 30. Application of such a configuration makes it possible to obtain circuit characteristics such that an impedance is constant on the low-frequency side and increases on the high-frequency side by a series circuit of the inductor and the resistor. Further, application of this embodiment makes it possible to accurately control the resistance values of the variable resistance circuits to a constant value and obtain good frequency characteristics.

Incidentally, in the previously described embodiment, in the second variable resistance unit included in the amplifying circuit 10 and the fourth variable resistance unit included in the correction circuit 30, the resistor to be disposed in parallel with the PMOS transistor is omitted, but the resistor may be disposed in parallel with the PMOS transistor. Further, although the switch 34 for supplying the output of the operational amplifier 31 included in the correction circuit 30 to one of the signal lines NDA and NDB is provided, even when the output of the operational amplifier 31 is designed to be supplied to the control circuit 50 as well as to be supplied as the analog control voltage without providing the switch 34, the similar operation is enabled.

Further, in the second variable resistance unit and the fourth variable resistance unit in which the resistance values are controlled by the analog control voltage, the two correction units are provided, but three or more correction units may be connected in parallel. Further, the potentials to be supplied to the gates of the PMOS transistors in the respective correction units at a digital correction time may be different.

Further, the aforementioned embodiments merely illustrate concrete examples of implementing the present invention, and the technical scope of the present invention is not to be construed in a restrictive manner by these embodiments. That is, the present invention may be implemented in various forms without departing from the technical spirit or main features thereof.

The disclosed amplifier circuit can roughly adjust a resistance value by a digital code controlling and finely adjust a resistance value by an analog control voltage controlling, and it is possible to accurately control resistance values of resistance loads in the amplifier circuit and improve noise immunity.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An amplifier circuit, comprising:
an input circuit configured to receive an input signal;
a load circuit that is provided in series with the input circuit between a first power supply line and a second power supply line and includes a first variable resistance unit and a second variable resistance unit, a resistance value of the first variable resistance unit being controlled by a digital code, a resistance value of the second variable resistance unit being controlled by an analog control voltage; and
a correction circuit that is provided between the first power supply line and the second power supply line, and includes a third variable resistance unit having a circuit configuration corresponding to the first variable resistance unit and a fourth variable resistance unit having a circuit configuration corresponding to the second variable resistance unit, a resistance value of the third variable resistance unit being controlled by the digital code, a resistance value of the fourth variable resistance unit being controlled by the analog control voltage, the correction circuit being configured to correct a resistance value of the load circuit.

2. The amplifier circuit according to claim 1, comprising:
a control circuit configured to generate the digital code based on an output of the correction circuit.

3. The amplifier circuit according to claim 2, wherein
the correction circuit includes an operational amplifier to which a voltage generated by the third variable resistance unit and the fourth variable resistance unit and a reference voltage are input,
in a first state, the control circuit generates the digital code based on an output of the operational amplifier, and
in a second state, the output of the operational amplifier is output as the analog control voltage.

4. The amplifier circuit according to claim 3, wherein
the digital code corresponding to a first resistance value is determined by using the third variable resistance unit in the correction circuit, and
the determined digital code corresponding to the first resistance value is supplied to the third variable resistance unit, and the analog control voltage is generated by using the third variable resistance unit and the fourth variable resistance unit so that a combined resistance value by the third variable resistance unit and the fourth variable resistance unit becomes the first resistance value.

5. The amplifier circuit according to claim 2, wherein
the digital code corresponding to a first resistance value is determined by using the third variable resistance unit in the correction circuit, and
the determined digital code corresponding to the first resistance value is supplied to the third variable resistance unit, and the analog control voltage is generated by using the third variable resistance unit and the fourth variable resistance unit so that a combined resistance value by the third variable resistance unit and the fourth variable resistance unit becomes the first resistance value.

6. The amplifier circuit according to claim 5, wherein
the digital code corresponding to the first resistance value is determined one bit by one bit based on a comparison result obtained by successively changing the digital code and comparing a voltage generated by the third variable resistance unit and the fourth variable resistance unit and a reference voltage, and
the analog control voltage is generated by negatively feeding back the comparison result of the voltage generated by the third variable resistance unit and the fourth variable resistance unit and the reference voltage to the fourth variable resistance unit so that a combined resistance value by the third variable resistance unit and the fourth variable resistance unit becomes the first resistance value.

7. The amplifier circuit according to claim 5, wherein
each of the first variable resistance unit and the third variable resistance unit includes a plurality of resistors provided in parallel and transistors configured to control whether or not to supply current to the resistors according to the digital code, each of the second variable resistance unit and the fourth variable resistance unit includes a plurality of transistors provided in parallel and having gates thereof to which the analog control voltage is supplied, and when the digital code corresponding to the first resistance value is determined, a constant voltage is supplied to each of the gates of the plurality of transistors included in the fourth variable resistance unit.

8. The amplifier circuit according to claim 7, wherein
a power supply potential is supplied to the gate of at least one of the plurality of transistors included in the fourth variable resistance unit, and a reference potential is supplied to the gate of at least one of the other transistors included in the fourth variable resistance unit.

9. The amplifier circuit according to claim 2, wherein
each of the first variable resistance unit and the third variable resistance unit includes a plurality of resistors provided in parallel and transistors configured to control whether or not to supply current to the resistors according to the digital code, and
each of the second variable resistance unit and the fourth variable resistance unit includes a plurality of transistors provided in parallel and having gates thereof to which the analog control voltage is supplied.

10. The amplifier circuit according to claim 1, wherein
the digital code corresponding to a first resistance value is determined by using the third variable resistance unit in the correction circuit, and
the determined digital code corresponding to the first resistance value is supplied to the third variable resistance unit, and the analog control voltage is generated by using the third variable resistance unit and the fourth variable resistance unit so that a combined resistance value by the third variable resistance unit and the fourth variable resistance unit becomes the first resistance value.

11. The amplifier circuit according to claim 1, wherein
each of the first variable resistance unit and the third variable resistance unit includes a plurality of resistors provided in parallel and transistors configured to control whether or not to supply current to the resistors according to the digital code, and
each of the second variable resistance unit and the fourth variable resistance unit includes a plurality of transistors provided in parallel and having gates thereof to which the analog control voltage is supplied.

12. A reception circuit, comprising:
an amplifier circuit configured to amplify an input serial signal;
a comparator configured to sample the input serial signal amplified by the amplifier circuit; and
a demultiplexer circuit configured to perform a serial-parallel conversion on an output of the comparator and outputs a parallel signal, wherein
the amplifier circuit includes:
an input circuit configured to receive the input serial signal;
a load circuit that is provided in series with the input circuit between a first power supply line and a second power supply line and includes a first variable resistance unit and a second variable resistance unit, a resistance value of the first variable resistance unit being controlled by a digital code, a resistance value of the second variable resistance unit being controlled by an analog control voltage; and
a correction circuit that is provided between the first power supply line and the second power supply line, and includes a third variable resistance unit having a circuit configuration corresponding to the first variable resistance unit and a fourth variable resistance unit having a circuit configuration corresponding to the second variable resistance unit, a resistance value of the third variable resistance unit being controlled by the digital code, a resistance value of the fourth variable resistance unit being controlled by the analog control voltage, the correction circuit being configured to correct a resistance value of the load circuit.

13. The reception circuit according to claim 12, comprising:
a control circuit configured to generate the digital code based on an output of the correction circuit.

14. The reception circuit according to claim 13, wherein
the correction circuit includes an operational amplifier to which a voltage generated by the third variable resistance unit and the fourth variable resistance unit and a reference voltage are input,
in a first state, the control circuit generates the digital code based on an output of the operational amplifier, and
in a second state, the output of the operational amplifier is output as the analog control voltage.

15. The reception circuit according to claim 12, wherein
the digital code corresponding to a first resistance value is determined by using the third variable resistance unit in the correction circuit, and
the determined digital code corresponding to the first resistance value is supplied to the third variable resistance unit, and the analog control voltage is generated by using the third variable resistance unit and the fourth variable resistance unit so that a combined resistance value by the third variable resistance unit and the fourth variable resistance unit becomes the first resistance value.

16. The reception circuit according to claim 12, wherein
each of the first variable resistance unit and the third variable resistance unit includes a plurality of resistors provided in parallel and transistors configured to control whether or not to supply current to the resistors according to the digital code, and
each of the second variable resistance unit and the fourth variable resistance unit includes a plurality of transistors provided in parallel and having gates thereof to which the analog control voltage is supplied.

17. A semiconductor integrated circuit, comprising:
an amplifier circuit configured to amplify an input serial signal;
a comparator configured to sample the input serial signal amplified by the amplifier circuit;
a demultiplexer circuit configured to perform a serial-parallel conversion on an output of the comparator and outputs a parallel signal; and
an internal circuit configured to perform a processing operation by receiving the parallel signal from the demultiplexer circuit, wherein
the amplifier circuit includes:
an input circuit configured to receive the input serial signal;
a load circuit that is provided in series with the input circuit between a first power supply line and a second power supply line and includes a first variable resistance unit and a second variable resistance unit, a resistance value of the first variable resistance unit being controlled by a digital code, a resistance value of the second variable resistance unit being controlled by an analog control voltage; and a correction circuit that is provided between the first power supply line and the second power supply line, and includes a third variable resistance unit having a circuit configuration corresponding to the first variable resistance unit and a fourth variable resistance unit having a circuit configuration corresponding to the second variable resistance unit, a resistance value of the third variable resistance unit being controlled by the digital code, a resistance value of the fourth variable resistance unit being controlled by the analog control voltage, the correction circuit being configured to correct a resistance value of the load circuit.

18. The semiconductor integrated circuit according to claim 17, comprising:
   a control circuit configured to generate the digital code based on an output of the correction circuit.

19. The semiconductor integrated circuit according to claim 18, wherein
   the correction circuit includes an operational amplifier to which a voltage generated by the third variable resistance unit and the fourth variable resistance unit and a reference voltage are input,
   in a first state, the control circuit generates the digital code based on an output of the operational amplifier, and
   in a second state, the output of the operational amplifier is output as the analog control voltage.

20. The semiconductor integrated circuit according to claim 17, wherein
   the digital code corresponding to a first resistance value is determined by using the third variable resistance unit in the correction circuit, and
   the determined digital code corresponding to the first resistance value is supplied to the third variable resistance unit, and the analog control voltage is generated by using the third variable resistance unit and the fourth variable resistance unit so that a combined resistance value by the third variable resistance unit and the fourth variable resistance unit becomes the first resistance value.

21. The semiconductor integrated circuit according to claim 17, wherein
   each of the first variable resistance unit and the third variable resistance unit includes a plurality of resistors provided in parallel and transistors configured to control whether or not to supply current to the resistors according to the digital code, and
   each of the second variable resistance unit and the fourth variable resistance unit includes a plurality of transistors provided in parallel and having gates thereof to which the analog control voltage is supplied.

* * * * *